US011917569B2

(12) United States Patent
Fabrega

(10) Patent No.: US 11,917,569 B2
(45) Date of Patent: Feb. 27, 2024

(54) ENDPOINT CLOCK FREQUENCY ADJUSTMENT FOR NARROWBAND AND ULTRA-NARROWBAND COMMUNICATIONS IN MESH NETWORK

(71) Applicant: Landis+Gyr Innovations, Inc., Alpharetta, GA (US)

(72) Inventor: Daniel E. Fabrega, Marietta, GA (US)

(73) Assignee: Landis+Gyr Technology, Inc., Alpharetta, GA (US)

( * ) Notice: Subject to any disclaimer, the term of this patent is extended or adjusted under 35 U.S.C. 154(b) by 257 days.

(21) Appl. No.: 17/387,688

(22) Filed: Jul. 28, 2021

(65) Prior Publication Data

US 2023/0029531 A1   Feb. 2, 2023

(51) Int. Cl.
*H04W 56/00* (2009.01)
*H03B 5/04* (2006.01)
(Continued)

(52) U.S. Cl.
CPC .......... *H04W 56/0035* (2013.01); *H03B 5/04* (2013.01); *H03B 5/32* (2013.01); *H04W 84/18* (2013.01); *H04W 88/06* (2013.01)

(58) Field of Classification Search
CPC . H04W 56/0035; H04W 84/18; H04W 88/06; H04W 56/0015; H03B 5/04; H03B 5/32; H03L 7/093; H03L 7/099
See application file for complete search history.

(56) References Cited

U.S. PATENT DOCUMENTS 6,298,103 B1 * 10/2001 Huang .................... H04L 7/027
                                                                375/361
7,764,133 B1    7/2010 Nicholls
(Continued)

FOREIGN PATENT DOCUMENTS

WO    2017034869         3/2017
WO    WO-2017034869 A1 * 3/2017 ......... H04L 43/0817

OTHER PUBLICATIONS

"Frequency Offset Compensation for Crystal-free 802.15.4 Communication"; Mehta et al.; 2011 International Conference on Advanced Technologies for Communications (ATC 2011) (Year: 2011).*

(Continued)

*Primary Examiner* — Benjamin H Elliott, IV
(74) *Attorney, Agent, or Firm* — Kilpatrick Towsend & Stockton LLP

(57) ABSTRACT

Systems and methods are disclosed for adjusting clock frequencies of endpoint devices in a mesh network for narrowband and ultra-narrowband communications. An endpoint device receives a reference timing signal over a wireless network from a reference device in the network. The endpoint device determines the current value of the clock frequency of the endpoint device and further determines the frequency difference between the reference frequency of the reference timing signal and the current value of the clock frequency. Based on the frequency difference, the endpoint generates a control signal and applies the control signal to the crystal oscillator of the endpoint device to adjust the frequency of the crystal oscillator. The endpoint device communicates with another device in the network using the oscillating signal generated by the adjusted crystal oscillator.

20 Claims, 4 Drawing Sheets

(51) Int. Cl.
*H03B 5/32* (2006.01)
*H04W 84/18* (2009.01)
*H04W 88/06* (2009.01)

(56) References Cited

U.S. PATENT DOCUMENTS

| | | | |
|---|---|---|---|
| 7,791,419 B1* | 9/2010 | Lemkin | H04J 3/0685 331/158 |
| 8,264,226 B1* | 9/2012 | Olsson | G01V 3/10 324/67 |
| 9,356,717 B1* | 5/2016 | Huang | H04H 40/36 |
| 2001/0022536 A1* | 9/2001 | Kallio | H03L 7/00 331/25 |
| 2003/0152177 A1* | 8/2003 | Cahill-O'Brien | H04L 9/40 375/354 |
| 2007/0026830 A1* | 2/2007 | Guilford | G01R 23/173 455/260 |
| 2014/0167866 A1* | 6/2014 | Vasishtha | H03L 1/025 331/44 |
| 2014/0321586 A1* | 10/2014 | Lee | H03J 1/005 375/362 |
| 2015/0131607 A1* | 5/2015 | Koorapaty | H04W 72/542 370/330 |
| 2016/0306048 A1* | 10/2016 | Dunn | G04G 7/00 |
| 2017/0170837 A1* | 6/2017 | Sai | H03F 3/19 |
| 2017/0187481 A1* | 6/2017 | Huang | H04J 3/0688 |
| 2017/0310330 A1 | 10/2017 | Nakajima | |
| 2018/0070282 A1* | 3/2018 | Su | H04L 1/0001 |
| 2018/0115316 A1* | 4/2018 | Maheshwari | G01R 31/2849 |
| 2018/0146443 A1* | 5/2018 | Park | H04L 43/106 |
| 2018/0175865 A1* | 6/2018 | Gu | H03L 7/113 |
| 2018/0183489 A1* | 6/2018 | Rasmussen | H04L 1/0071 |
| 2019/0222239 A1* | 7/2019 | Fox | H04B 1/0096 |
| 2020/0127807 A1* | 4/2020 | Petkov | H04L 7/04 |
| 2020/0312260 A1* | 10/2020 | Kim | G09G 3/3696 |
| 2021/0336527 A1* | 10/2021 | Chang | H02M 1/12 |
| 2021/0400403 A1* | 12/2021 | Chen | H04R 1/1091 |
| 2021/0409031 A1* | 12/2021 | Ranganathan | H03L 7/1974 |
| 2022/0069971 A1* | 3/2022 | Gao | H04N 21/4305 |
| 2023/0007755 A1* | 1/2023 | Wang | H05B 47/105 |
| 2023/0029531 A1* | 2/2023 | Fabrega | H03B 5/04 |

OTHER PUBLICATIONS

International Application No. PCT/US2022/074115, International Search Report and Written Opinion dated Nov. 15, 2022, 10 pages.

* cited by examiner

ENDPOINT CLOCK FREQUENCY ADJUSTMENT FOR NARROWBAND AND ULTRA-NARROWBAND COMMUNICATIONS IN MESH NETWORK

TECHNICAL FIELD

This disclosure relates generally to narrowband and ultra-narrowband communications in a wireless network, and more particularly relates to adjusting the clock frequency at endpoint devices of the network.

BACKGROUND

Narrowband (NB) and ultra-narrowband (UNB) communications in a wireless network, such as an adaptive multi-rate (AMR) mesh network, are desirable in some cases where longer ranges are needed. An ultra-narrowband receiver is highly selective and can reject noise and interference which may enter the receiver outside its narrow bandwidth, enabling a good signal-to-noise ratio (SNR) to be achieved with a relatively weak received signal. However, NB and UNB systems are particularly challenging because the channel bandwidths are small and hence high-stability and high-accuracy frequency references are needed among endpoints. These high-stability frequency references, such as stratum 3 temperature-compensated crystal oscillators (TCXO) or oven-controlled crystal oscillators (OCXO), usually require high power consumption and are bulky and costly. Regular frequency references (e.g., regular TCXO), are unreliable because their stabilities will introduce frequency shifts that place the information spectrum outside the transceiver's intermediate frequency (IF) bandwidth and therefore prevent reliable communications.

SUMMARY

Aspects and examples are disclosed for apparatuses and processes for adjusting clock frequencies of endpoint devices in a mesh network for narrowband and ultra-narrowband communications. For instance, a method performed by an endpoint device in a mesh network includes, while operating in an initial communication mode, receiving a reference timing signal over a mesh network from a reference device in the mesh network, obtaining a current value of a frequency of the crystal oscillator of the endpoint device, determining a frequency difference between a reference frequency of the reference timing signal and the current value of the frequency, generating a control signal based on the frequency difference, adjusting the frequency of the crystal oscillator according to the control signal, and determining that an error of the frequency of the crystal oscillator satisfies a pre-determined condition. The method further includes in response to determining that an error of the frequency of the crystal oscillator satisfies a pre-determined condition, switching to a narrowband or ultra-narrowband communication mode. The data rate of the narrowband or ultra-narrowband communication mode is lower than the data rate of the initial communication mode. The method also includes transmitting to and receiving communication signals from another device in the mesh network using an oscillating signal generated by the crystal oscillator while operating in the narrowband or ultra-narrowband communication mode.

In another example, a system includes a reference device configured for transmitting a reference timing signal to a plurality of endpoint devices in a mesh network, and the plurality of endpoint devices. Each endpoint device of the plurality of endpoint devices is configured for, while operating in an initial communication mode, receiving the reference timing signal over the mesh network from the reference device, obtaining a current value of a frequency of a crystal oscillator of the endpoint device, determining a frequency difference between a reference frequency of the reference timing signal and the current value of the frequency of the crystal oscillator, generating a control signal based on the frequency difference, adjusting, according to the control signal, the crystal oscillator to adjust the frequency of the crystal oscillator, and determining that an error of the frequency of the crystal oscillator satisfies a pre-determined condition. The endpoint device is further configured for, in response to determining that an error of the frequency of the crystal oscillator satisfies a pre-determined condition, switching to a narrowband or ultra-narrowband communication mode and communicating with the reference device or another endpoint device in the mesh network using an oscillating signal generated by the crystal oscillator while operating in the narrowband or ultra-narrowband communication mode. The data rate of the narrowband or ultra-narrowband communication mode is lower than the data rate of the initial communication mode.

In yet another example, an endpoint device of a network includes a crystal oscillator configured for generating an oscillating signal with a frequency of the crystal oscillator, a processor configured to execute computer-readable instructions, and a memory configured to store the computer-readable instructions that, when executed by the processor, cause the processor to perform operations. The operations include, while operating in an initial communication mode, receiving a reference timing signal over the network from a reference device in the network, obtaining a current value of the frequency of the crystal oscillator, determining a frequency difference between a reference frequency of the reference timing signal and the current value of the frequency of the crystal oscillator, causing a control signal to be generated based on the frequency difference, adjusting the frequency of the crystal oscillator by applying the control signal to the crystal oscillator, and determining that an error of the frequency of the crystal oscillator satisfies a pre-determined condition. The operations further include causing the endpoint device to switch to a narrowband or ultra-narrowband communication mode in response to determining that an error of the frequency of the crystal oscillator satisfies a pre-determined condition. The data rate of the narrowband or ultra-narrowband communication mode is lower than the data rate of the initial communication mode. The operations also include, while operating in the narrowband or ultra-narrowband communication mode, causing the endpoint device to communicate with another device in the network using an oscillating signal generated by the crystal oscillator.

These illustrative aspects and features are mentioned not to limit or define the presently described subject matter, but to provide examples to aid understanding of the concepts described in this application. Other aspects, advantages, and features of the presently described subject matter will become apparent after review of the entire application.

BRIEF DESCRIPTION OF THE FIGURES

These and other features, aspects, and advantages of the present disclosure are better understood when the following Detailed Description is read with reference to the accompanying drawings.

DETAILED DESCRIPTION

Figure 1:
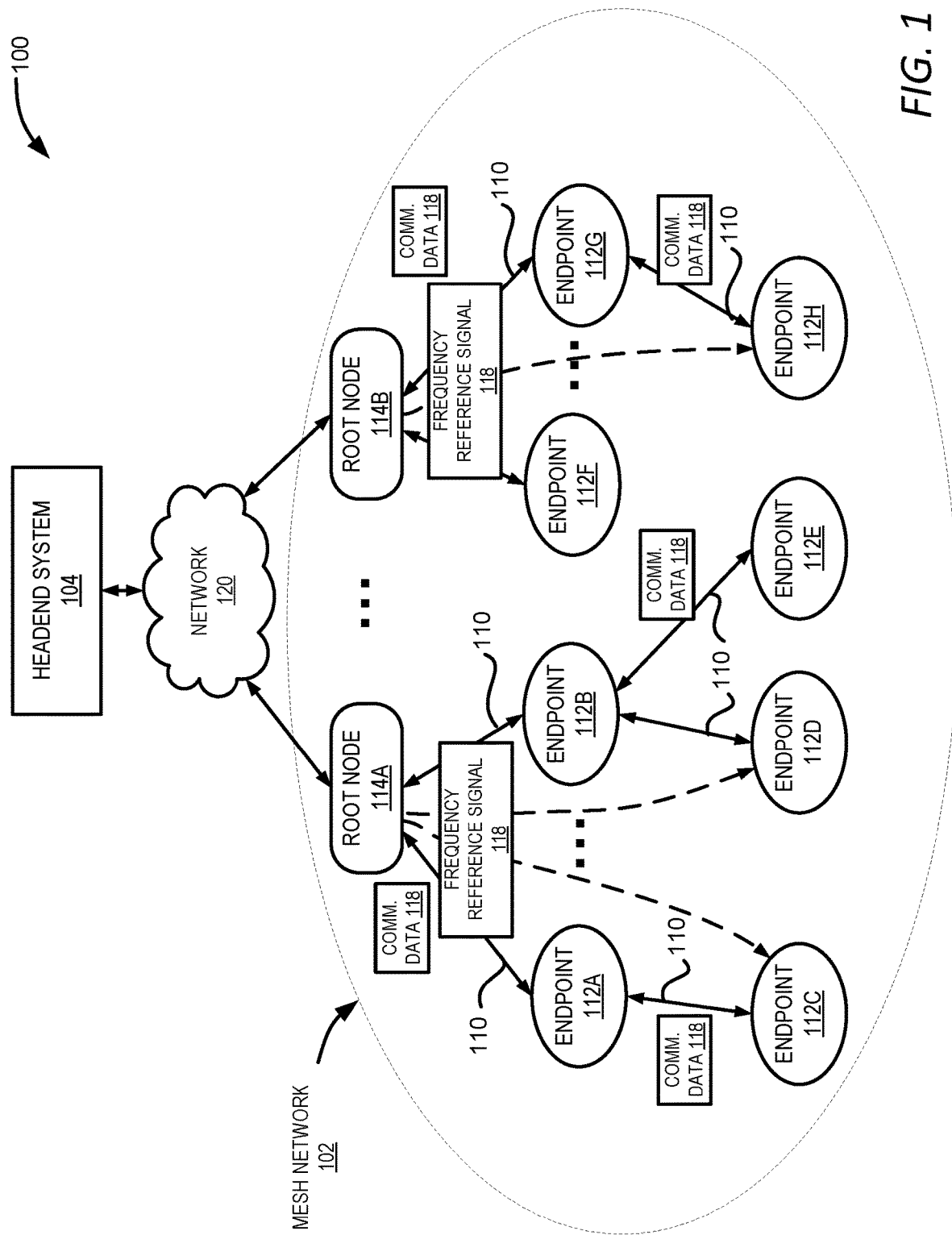
FIG. 1 is a block diagram showing an illustrative operating environment for adjusting clock frequencies of endpoint devices in a mesh network for narrowband and ultra-narrowband communications, according to certain aspects of the disclosure.

Systems and methods are provided for adjusting clock frequencies of endpoint devices in a networked system for narrowband and ultra-narrowband communications. Within a networked system, such as a mesh network, an endpoint device (also referred to as a "node") may be a device in the networked system capable of transmitting data to and receiving data from other endpoint devices or network devices. To provide proper adjustment to the clock frequency of an endpoint in the network, the endpoint device is in direct communication with a network device that has access to reference timing signals (referred to as a "reference device"), such as a gateway or a router.

For example, the reference device may be a router in the network that is equipped with a receiver that receives a reference timing signal. The receiver can be, for example, a global position system (GPS) receiver that receives 1 pulse per second (pps) reference timing signal along with the GPS information. The reference timing signal is generated by devices (e.g., GPS clocks) that are synchronized to a high-accuracy clock, such as the NIST-7 Cesium Frequency Standard. The reference device re-transmits the reference timing signal to the endpoint devices within the network. The endpoints that receive the reference timing signal can accurately adjust their clocks to the reference clock accuracy, hence making NB and UNB communications possible.

To adjust the clock frequency of an endpoint device for NB and UNB communications, the endpoint device can operate in a larger bandwidth communication mode at the beginning of the NB or UNB communication session so that the endpoint device does not miss the communication with the reference device. As the reference timing signal is received from the reference device, the endpoint device can adjust the frequency of the crystal clock oscillator of the endpoint device. To do so, the endpoint device determines the current clock frequency of the endpoint device. The endpoint device further calculates the difference between the reference frequency of the reference timing signal and the current frequency. The frequency difference can then be used to generate a control signal that is fed to the crystal clock oscillator of the endpoint device to adjust its frequency.

The endpoint device further determines the frequency error between the adjusted frequency and the reference frequency. If the error is within an acceptable range, the endpoint can switch to a narrowband or ultra-narrowband mode for communication. If the error is still too large, the endpoint repeats the above process to continue to adjust the frequency of the crystal clock oscillator of the endpoint device until the frequency error is within the acceptable range.

During the NB or UNB communication, the endpoint device continues to receive the reference timing signal from the reference device. The endpoint device can thus continue to adjust the frequency of the crystal clock oscillator based on the reference timing signal as described above. In this way, the clock frequency of the endpoint device can be maintained at a high accuracy level, thereby enabling reliable NB or UNB communications.

Techniques described in the present disclosure increase the feasibility and reliability of narrowband or ultra-narrowband communications. As discussed above, without the techniques described herein, endpoint devices with regular frequency references, such as TCXOs, cannot support reliable narrowband or ultra-narrowband communications due to the low stabilities of the regular frequency references (e.g., +/−2 ppm). By adjusting the clock frequency of the endpoint devices based on a reference timing signal received from a reference device, it is possible for endpoint devices with regular frequency references (e.g., regular crystal clock oscillators) to conduct narrowband or ultra-narrowband communications.

In addition, the continued adjustment of the clock frequency based on continuously received reference timing signal prevents large frequency shifts and ensures the information spectrum staying inside the transceiver's IF bandwidth, thereby enabling reliable communication. This eliminates the need of using high-stability and high-accuracy frequency references and thus reduces power consumption and the size of endpoint devices. As a result, the narrowband or ultra-narrowband communications can be conducted in a large variety of applications including those where power supplies and the spaces for the endpoint devices are limited.

FIG. 1 is a block diagram showing an illustrative operating environment for adjusting clock frequencies of endpoint devices in a mesh network for narrowband and ultra-narrowband communications, according to certain aspects of the disclosure. In the operating environment, a networked system 100 and a mesh network 102 provides a network infrastructure for smart devices (e.g., resource consumption meters, vehicles, home appliances, etc. that include communication technology) to communicate across a network of nodes (i.e., other smart devices), the internet, and/or an intranet.

The networked system 100 includes a headend system 104, which may function as a central processing system that receives a stream of data from a network 120. The network 120 may be the internet, an intranet, or any other data communication network. The mesh network 102 may include various endpoint devices or nodes 112A-112H (which may be referred to herein individually as an endpoint device, an endpoint, or a node 112 or collectively as the endpoint devices, endpoints, or nodes 112). These endpoint devices 112 include nodes such as measuring nodes for collecting data from the respective deployed location of the nodes, processing nodes for processing data available to the nodes, router nodes for forwarding data received from one node to another node in the mesh network 102, or nodes that are configured to perform a combination of these functions.

In one example, the mesh network 102 is associated with a resource distribution network to deliver measurement data or other data obtained in the resource distribution network. In this example, the endpoints 112 can include meters deployed at various geographical locations of the customer premises through the resource distribution network, such as electricity meters, gas meters, water meters, steam meters, etc., and be implemented to measure various operating characteristics of the resource distribution network. In the example of a power distribution network, example characteristics include, but are not limited to, average or total power consumption, the peak voltage of the electrical signal, power surges, and load changes. The endpoints 112 transmit the collected data through the mesh network 102 to root nodes 114A and 114B (which may be referred to herein individually as a root node 114 or collectively as the root nodes 114).

Root nodes 114 of the mesh network 102 may be configured for communicating with the endpoints 112 to perform operations such as managing the endpoints 112, collecting data from the endpoints 112, and forwarding data to a headend system 104. A root node 114 can also be configured to function as a node or endpoint device to measure and process data itself. The root nodes 114 may be personal area network (PAN) coordinators, gateways, routers, or any other devices capable of communicating with the headend system 104. The root nodes 114 ultimately transmit the generated and collected data to the headend system 104 via the network 120. In addition, the root nodes 114 may also receive from the headend system 104 network management messages and transmit the network management messages to the endpoints 112. Likewise, the root node 114 itself or the endpoints 112 may also issue and transmit network management messages to other endpoints 112. The data and network management transmitted between nodes 114 and 112 may be collectively referred to herein as "communication data." These communication data are transmitted and routed through data links 110 between nodes 114 and 112.

Communication data are typically routed between a node and the headend system 104 or among the nodes according to a node hierarchy of the mesh network 102. For example, the root node 114A, which communicates directly with the headend system 104 through the network 120, may generally be referred to as a parent node due to data links with the endpoints 112A and 112B that are located at a node layer (e.g., layer one) below the root node 114A. During the operations, the endpoints 112 may all funnel information up through the node layers to the root node 114 and ultimately to the headend system 104.

To communicate with other endpoints 112 or root nodes 114, each endpoint 112 and node 114 is equipped with a crystal clock oscillator, such as a voltage-controlled temperature-compensated crystal oscillator (VCTCXO), to generate signals within the communication bandwidth for communications with other devices on the network 102. Due to temperature and aging, the crystal clock oscillator may have frequency shifts that place the information spectrum outside the communication bandwidth leading to unreliable communications. To address the frequency shift, each endpoint 112 or node 114 is configured to adjust its frequency based on a reference timing signal 118 received from a reference device that is within its communication range. The reference device can be a root node 114 or another endpoint 112 configured with the capability of receiving a reference timing signal from a reliable source. For example, a root node 114 may be a router that is equipped with a GPS receiver and therefore receives a 1 pps timing signal along with the GPS information. Because GPS clocks are synchronized to the NIST-7 Cesium Frequency Standard, which is one of the most accurate clocks in the world, the 1 pps timing signal received by the router can serve as a reference timing signal for adjusting the clock frequency of the endpoints 112 in the mesh network 102. Additional details regarding adjusting clock frequencies of endpoint devices in a mesh network for narrowband or ultra-narrowband communications are provided below with respect to FIGS. 2 and 3.

In operation, fewer or more endpoints 112 may be included in the mesh network 102, and more root nodes 114 may also be included in the networked system 100. Moreover, while FIG. 1 depicts a specific network topology (e.g., a DODAG tree topology), other network topologies are also possible (e.g., a ring topology, a mesh topology, a star topology, etc.).

Figure 2:
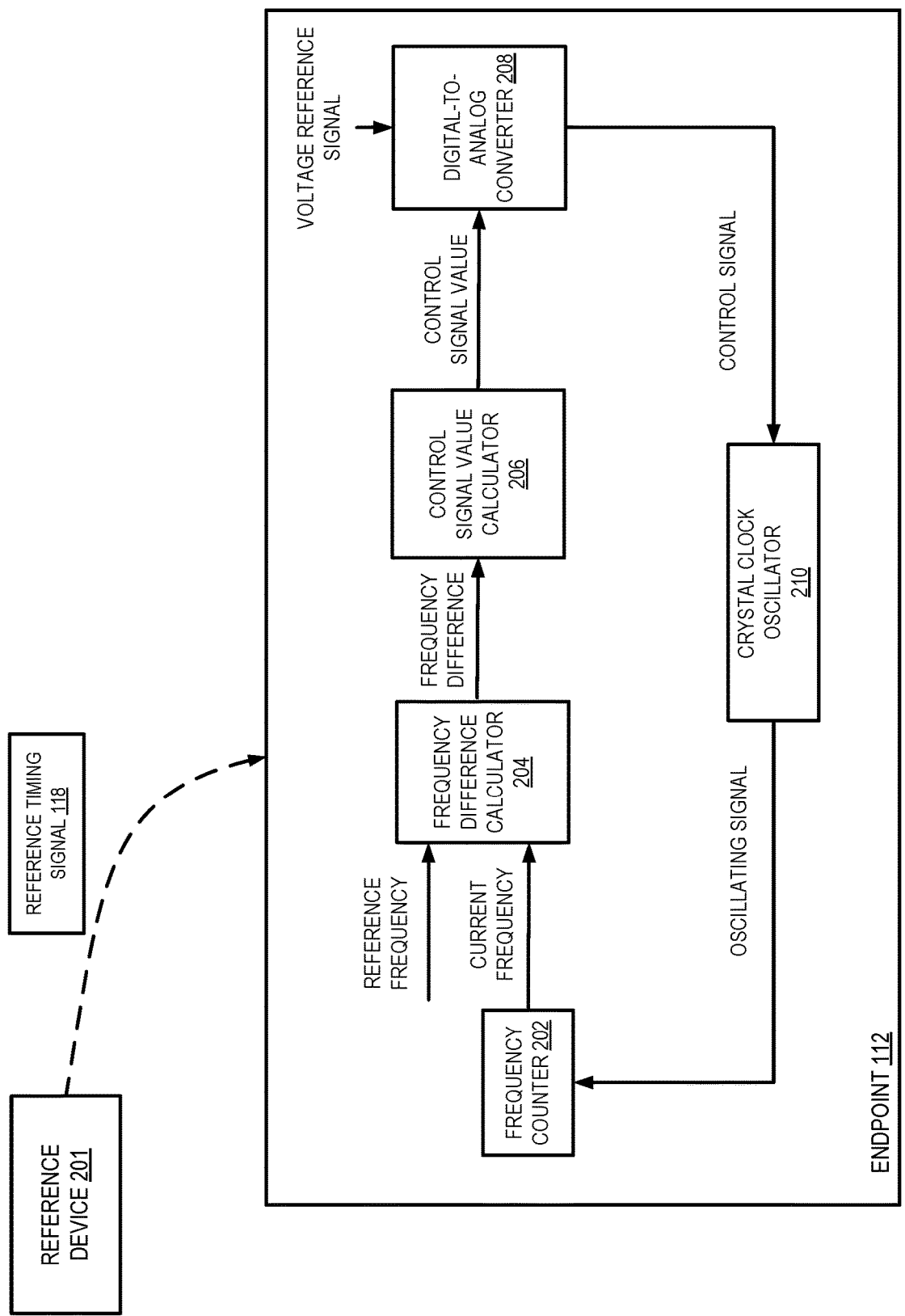
FIG. 2 is a block diagram illustrating an example of a frequency reference device and its associated endpoint device that receives reference timing signals from the reference device, according to certain aspects of the disclosure.

FIG. 2 is a block diagram illustrating an example of a reference device 201 and an endpoint device 112 that receives reference timing signals 118 from the reference device 201 for frequency adjustment, according to certain aspects of the disclosure. As discussed above with respect to FIG. 1, the reference device 201 may be a device in the mesh network 102 that is equipped with a receiver that receives a reference timing signal, such as a GPS receiver that receives the 1 pps reference timing signal along with the GPS information. The reference device 201 may be a root node 114, a router, a gateway, another endpoint device 112, or any other device in the mesh network.

The reference device 201 can re-transmit the received reference timing signal 118 to endpoints 112 that are in direct communication with the reference device 201 so that the endpoint devices 112 can adjust their respective clock frequencies based on the reference timing signal 118. In some examples, the reference device 201 re-transmits the reference timing signal 118 to the endpoints 112 following a mesh network protocol, such as a protocol following the IEEE 802.15.4g standard. For example, the reference device 201 can re-transmit reference timing signal 118 via a common 50 kbps channel using the frequency-shift keying (FSK) modulation according to the mesh network protocol.

The endpoint 112 receives the reference timing signal 118 and adjusts the frequency of its crystal clock oscillator 210 accordingly. To do so, the endpoint device 112 determines the difference between the frequency of the reference timing signal 118 (referred to as the "reference frequency") and the current frequency of the crystal clock oscillator 210 of the endpoint device 112. The current frequency of the endpoint 112 can be determined by a frequency counter 202 processing the oscillating signal generated by the crystal clock oscillator 210 so that it can be compared to the reference frequency. In some examples, the frequency counter 202 may be implemented using a regular temperature-compensated crystal oscillator (TCXO).

The frequency of the reference timing signal 118 and the current frequency of the endpoint device 112 can be input to a frequency difference calculator 204 to determine the frequency difference. Based on the frequency difference, a control signal value calculator 206 determines the value of a control signal used to control the frequency of the crystal clock oscillator 210. In some examples, the control signal value calculator 206 maps the frequency difference to the value of the control signal according to a look-up table. Depending on the type of the crystal clock oscillator 210, the control signal may be a voltage signal or other types of signals. In the example where the crystal clock oscillator 210 is a voltage-controlled oscillator, the control signal is a voltage signal and the look-up table contains the mapping of various frequency differences to respective voltage values for the control signal.

The determined control signal value can be converted to a control signal by a digital-to-analog converter (DAC) 208. In some examples, a high precision and stability series voltage reference signal is used for the DAC 208. This voltage reference signal provides high precision and stability for the output frequency of the crystal clock oscillator 210. In the example where the crystal clock oscillator 210 is a VCTCXO, this voltage reference signal is directly proportional or one-to-one maps to frequency stability in the VCTCXO. The DAC output voltage represents a linear mapping with the output frequency of the VCTCXCO. Therefore, the more stable the voltage reference signal is, the higher the output frequency stability of the VCTCXO. As such, by using the high precision and stability series voltage reference signal, the DAC within the endpoint device 112 can precisely map the error between the received reference timing signal 118 and the oscillating signal coming from the crystal clock oscillator 210. The control signal output by the DAC 208 is adjusted proportionally to the difference between the reference frequency of the reference timing signal 118 and the output frequency of the crystal clock oscillator 210. The control signal is then used to adjust the crystal clock oscillator 210 to align its frequency with the frequency of the reference timing signal 118. In one example, the crystal clock oscillator 210 is a VCTCXO. VCTCXOs have a high quality factor, just like TCXOs, and therefore low modulation sensitivity (Kv) or tuneability. The sensitivity is usually in the order of +/−8 ppm/volt for a typical 39 MHz unit. A low sensitivity ensures that the frequency remains stable for a long period of time without requiring constant updates from the DAC 208.

The oscillating signal generated by the crystal clock oscillator 210 after the adjustment is then provided to the frequency counter 202 for frequency calculation. In the meantime, the endpoint device 112 continuously receives the reference timing signal 118 from the reference device 201. As such, the above adjustment process can be repeated to maintain the frequency accuracy of the crystal clock oscillator 210. This frequency adjustment can potentially achieve the same accuracy as the reference timing signal 118 thereby providing reliable narrowband or ultra-narrowband communications.

In FIG. 2, the frequency difference calculator 204 and the control signal value calculator 206 may be implemented as software or hardware. In addition, while the frequency difference calculator 204 and the control signal value calculator 206 are described as separate components, they may be implemented in a single software or hardware component. In some examples, the frequency counter 202, frequency difference calculator 204, control signal value calculator 206, and the digital-to-analog converter 208 may be implemented in a microcontroller of the endpoint device 112.

Figure 3:
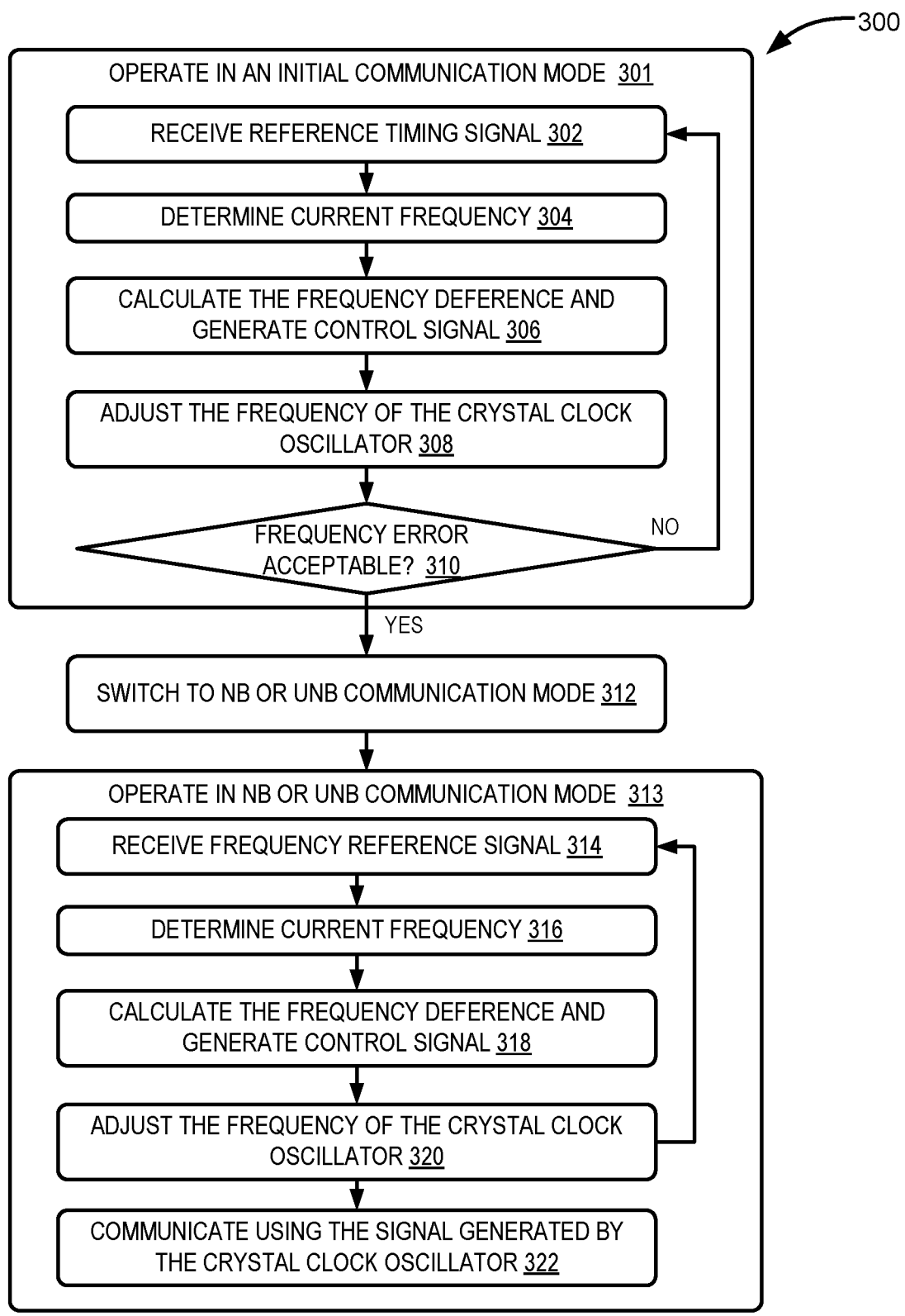
FIG. 3 shows a flow diagram that illustrates a process for adjusting the clock frequency of an endpoint device in a mesh network for narrowband and ultra-narrowband communications, according to certain aspects of the disclosure.

FIG. 3 shows a flow diagram that illustrates a process 300 for adjusting the clock frequency of an endpoint device in a mesh network for narrowband or ultra-narrowband communications, according to certain aspects of the disclosure. One or more endpoints 112 of the network 102 implement operations depicted in FIG. 3. For illustrative purposes, the process 300 is described with reference to certain examples depicted in the figures. Other implementations, however, are possible.

At block 301, the process 300 involves the endpoint device 112 operating in an initial communication mode. In the initial communication mode, the endpoint device 112 communicates using signals with larger bandwidth or a higher data rate (e.g., 50 kbps) than that of the NB or UNB communications (e.g., 100 bps to 6.25 kbps). The larger bandwidth and higher data rate in the initial communication mode allow for greater frequency errors without losing communication. In other words, the endpoint device 112 can receive the reference timing signal 118 from the reference device 201 even if the frequency of the crystal clock oscillator 210 has a large deviation from the reference frequency.

While operating in the initial communication mode, the endpoint device 112 receives the reference timing signal 118 from the reference device 201 at block 302. In some examples, the reference device 201 transmits the reference timing signal 118 at different frequency channels according to a channel hopping sequence. In this way, endpoint devices 112 operating at different channels can all receive the reference timing signal 118. At block 304, the endpoint device 112 determines the current frequency of the crystal clock oscillator 210. The endpoint device 112 can use a frequency counter 202 to count the current frequency of the oscillating signal generated by the crystal clock oscillator 210.

At block 306, the process 300 involves the endpoint device 112 calculating the difference between the reference frequency of the reference timing signal 118 and the current frequency of the crystal clock oscillator 210. The endpoint device 112 further maps the frequency difference to a value of a control signal, for example, through a look-up table. For example, if the crystal clock oscillator 210 is a VCTCXO, the control signal is a voltage control signal and the endpoint device 112 maps the frequency difference to a voltage value of a control signal. In some examples, the mapping is linear in that the frequency difference is proportionally mapped to a voltage value for the control signal. The control signal value is then used to generate a control signal, for example, through the digital-to-analog converter 208. In some examples, a high precision and stability series voltage reference signal is provided to the DAC 208 so that the DAC can precisely map the frequency difference to a voltage control signal.

At block 308, the process 300 involves the endpoint device 112 adjusting the frequency of the crystal clock oscillator 210 by providing the control signal to the crystal clock oscillator 210. In the example where the crystal clock oscillator 210 is a VCTCXO, the voltage control signal generated by the DAC 208 is provided to the VCTCXO so that the frequency of the oscillating signal generated by the VCTCXO is adjusted to be closer to the reference frequency.

In some scenarios, especially when the initial difference between the reference frequency and the frequency of the crystal clock oscillator 210 is large, the operations involved in blocks 302 to 308 need to be repeated multiple times to gradually change the frequency of the crystal clock oscillator 210 to match the reference frequency. After a predetermined number of adjustments or a predetermined time period, the endpoint device 112 determines, at block 310, whether the frequency error is acceptable or whether a condition for the frequency error is satisfied. In one example, the frequency error is determined to be the percentage of the frequency difference over the channel bandwidth. The frequency error is acceptable or the condition is satisfied if the frequency error is smaller than a threshold value, such as 10%. In this example, the acceptable absolute frequency difference depends on the bandwidth. Larger bandwidth allows a larger frequency deviation from the reference frequency and vice versa. Note that the channel bandwidth used to determine the acceptable frequency error is the bandwidth of the intended NB or UNB communication, rather than the bandwidth of the initial communication mode.

If it is determined at block 310 that the frequency error is not acceptable, the endpoint device 112 remains in the initial communication mode to continue to adjust the frequency of the crystal clock oscillator 210. If the frequency error is within the acceptable range, the endpoint device 112 switches to the NB or UNB communication mode at block 312 to operate on the intended narrowband or ultra-narrowband mode. While operating in the NB or UNB communication mode at block 313, the endpoint device 112 continues to adjust the frequency of the crystal clock oscillator 210 to match or be close to the reference frequency. To do so, the endpoint device 112 continues to receive the reference timing signal 118 from the reference device 201 in a way similar to block 302 but through the narrowband or ultra-narrowband communication channel. Because the frequency of the crystal clock oscillator 210 has been adjusted to be within the acceptable range, the endpoint device 112 can reliably receive the reference timing signal 118 and other communication through the narrowband or ultra-narrowband communication channel. The frequency adjustment performed while the endpoint device 112 operates in the NB or UNB communication mode ensures that the frequency of the endpoint device 112 does not shift too far away from the reference frequency to render the NB or UNB communication unreliably.

At block 316, the endpoint device 112 determines the current frequency of the crystal clock oscillator 210. At block 318, the endpoint device 112 calculates the frequency difference between the reference frequency and the current frequency of the crystal clock oscillator 210. Based on the difference, the endpoint device 112 generates a control signal. At block 320, the crystal clock oscillator 210 uses the control signal to adjust the frequency of the crystal clock oscillator 210. Blocks 314-320 are similar to blocks 302-308, respectively. At block 322, the endpoint device 112 communicates with other devices in the network using the signal generated by the crystal clock oscillator 210 via NB or UNB communication. As the endpoint device 112 continues to receive reference timing signal 118 from the reference device 201, the endpoint device 112 repeats the adjustment operations in blocks 314-320 to ensure the frequency of the crystal clock oscillator 210 to be the same or close to the reference frequency.

Systems supporting reliable NB or UNB has a wide variety of application in the Internet of Things (IoT). For example, the NB or UNB systems can be used for low power wide area (LPWA) sensor/control networks for applications that include smart cities, utilities, and infrastructure networks. Because of the high link budget of the NB or UNB communications, multiple thousands of endpoints scattered over a wide area can be served by a base station (BS) acting as a concentrator with a low deployment density, such as one BS per 10 square kilometers.

Further, while the above descriptions focus on adjusting clock frequencies of endpoint devices in a mesh network, the technologies presented herein also apply to other types of wireless networks that benefit from NB or UNB communications.

Exemplary Node

Figure 4:
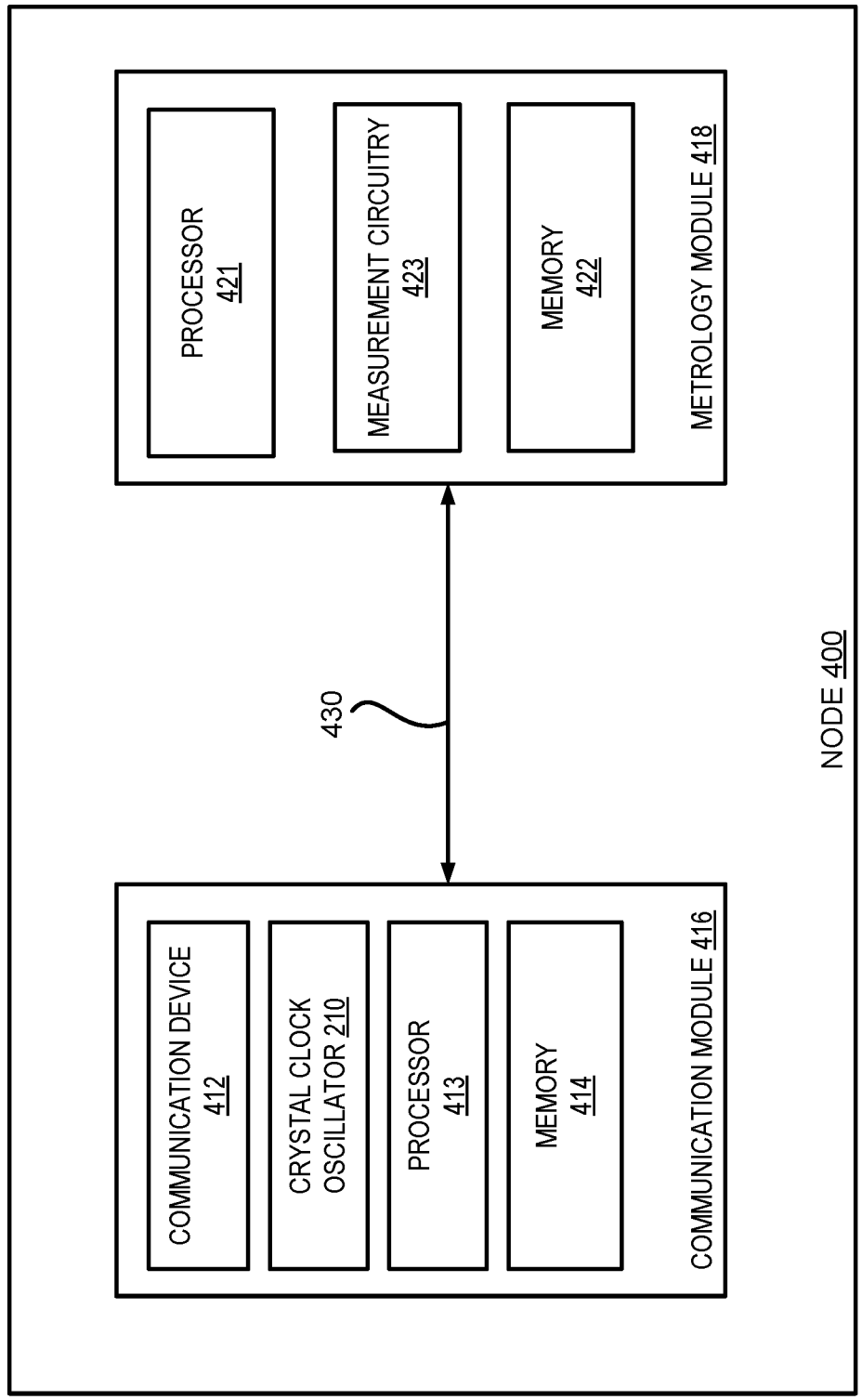
FIG. 4 is an example of a block diagram of an endpoint of the networked system of FIG. 1, according to certain aspects of the disclosure.

FIG. 4 is an example of a block diagram of components of an endpoint 112 or a node 114 of the mesh network 102. Some or all of the components of a node 400 can belong to one or more of the endpoint 112 or node 114 of FIG. 1. The node 400 includes a communication module 416. The function of the communication module 416 includes sending and receiving various signals to and from other nodes in the mesh network 102, such as the communication data, the reference timing signal 118, and other network communication messages.

The communication module 416 may include a communication device 412 such as an antenna and a radio. Alternatively, the communication device 412 may be any device that allows wireless or wired communication. The communication device 412 may include a transceiver device, such as an RF transceiver, capable of transmitting and receiving RF communication from other nodes in the mesh network 102. The communication module 416 may also include a processor 413, and memory 414. The processor 413 controls functions performed by the communication module 416, such as the one or more of the operations described above with respect to FIGS. 1-3. The memory 414 may be utilized to store data used by the processor 413 to perform its function. The communication module 416 further includes the crystal clock oscillator 210 and other components not shown in FIG. 4, such as the frequency counter 202 and the DAC 208.

In some examples, the node 400 may optionally include a metrology module 418 connected to the communication module 416 through a local or serial connection 430. The function of the metrology module 418 includes the functions necessary to manage the resource, in particular, to allow access to the resource and to measure the resource used. The metrology module 418 may include a processor 421, memory 422, and measurement circuitry 423. The measurement circuitry 423 handles the measuring of the resource and may be used as the sensor to collect sensor data. The processor 421 in the metrology module 418 controls functions performed by the metrology module 418. The memory 422 stores data needed by the processor 421 to perform its functions. The metrology module 418 may also include sensing circuitry, such as in the measurement circuitry 423, for sensing characteristics of the node 400 (e.g., the power status). The communication module 416 and the metrology module 418 communicate with each other through the local connection 430 to provide data needed by the other module, including the power status data. Both the communication module 416 and the metrology module 418 may include computer-executable instructions stored in memory or in another type of computer-readable medium and one or more processors within the modules may execute the instructions to provide the functions described herein.

General Considerations

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The features discussed herein are not limited to any particular hardware architecture or configuration. A computing device can include any suitable arrangement of components that provide a result conditioned on one or more inputs. Suitable computing devices include multipurpose microprocessor-based computer systems accessing stored software (i.e., computer-readable instructions stored on a memory of the computer system) that programs or configures the computing system from a general-purpose computing apparatus to a specialized computing apparatus implementing one or more aspects of the present subject matter. Any suitable programming, scripting, or other type of language or combinations of languages may be used to implement the teachings contained herein in software to be used in programming or configuring a computing device.

Aspects of the methods disclosed herein may be performed in the operation of such computing devices. The order of the blocks presented in the examples above can be varied; for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific aspects thereof, it will be appreciated that those skilled in the art, upon attaining an understanding of the foregoing, may readily produce alterations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. A method performed by an endpoint device in a mesh network for adjusting a frequency of a crystal oscillator of the endpoint device, the method comprising:
   while operating in an initial communication mode,
      receiving a reference timing signal over a mesh network from a reference device in the mesh network, wherein the reference device is synchronized to a clock with a frequency of higher accuracy and stability than the frequency of the crystal oscillator;
      obtaining a current value of a frequency of the crystal oscillator of the endpoint device;
      determining a frequency difference between a reference frequency of the reference timing signal and the current value of the frequency;
      generating a control signal based on the frequency difference;
      adjusting the frequency of the crystal oscillator according to the control signal; and
      determining that an error of the frequency of the crystal oscillator satisfies a pre-determined condition;
   in response to determining that an error of the frequency of the crystal oscillator satisfies a pre-determined condition, switching to a narrowband or ultra-narrowband communication mode, wherein a data rate of the narrowband or ultra-narrowband communication mode is lower than a data rate of the initial communication mode; and
   transmitting to and receiving communication signals from another device in the mesh network using an oscillating signal generated by the crystal oscillator while operating in the narrowband or ultra-narrowband communication mode.

2. The method of claim 1, wherein the control signal is a voltage control signal generated with a voltage value in proportion to the frequency difference.

3. The method of claim 2, wherein the voltage control signal is generated based on a voltage reference signal.

4. The method of claim 1, further comprising:
   while operating in the narrowband or ultra-narrowband communication mode,
      receiving a reference timing signal over the mesh network from the reference device;
      obtaining an updated current value of the frequency of the crystal oscillator;
      determining an updated frequency difference between the reference frequency and the updated current value of the frequency;
      generating a second control signal based on the updated frequency difference;
      adjusting the frequency of the crystal oscillator according to the second control signal; and
      transmitting to and receiving communication signals from the another device using the oscillating signal generated by the crystal oscillator.

5. The method of claim 1, wherein the pre-determined condition is determined based, at least in part, upon a bandwidth of the narrowband or ultra-narrowband communication mode.

6. The method of claim 1, wherein the crystal oscillator is a voltage-controlled temperature-compensated crystal oscillator (VCTCXO).

7. The method of claim 1, wherein the reference timing signal is transmitted from the reference device to the endpoint device according to a protocol following IEEE 802.15.4g.

8. A system, comprising:
   a reference device configured for transmitting a reference timing signal to a plurality of endpoint devices in a mesh network; and
   the plurality of endpoint devices, each endpoint device of the plurality of endpoint devices configured for:
      while operating in an initial communication mode,
         receiving the reference timing signal over the mesh network from the reference device;
         obtaining a current value of a frequency of a crystal oscillator of the endpoint device, wherein the reference device is synchronized to a clock with a frequency of higher accuracy and stability than the frequency of the crystal oscillator;
         determining a frequency difference between a reference frequency of the reference timing signal and the current value of the frequency of the crystal oscillator;
         generating a control signal based on the frequency difference;
         adjusting, according to the control signal, the crystal oscillator to adjust the frequency of the crystal oscillator; and
         determining that an error of the frequency of the crystal oscillator satisfies a pre-determined condition;
      in response to determining that an error of the frequency of the crystal oscillator satisfies a pre-determined condition, switching to a narrowband or ultra-narrowband communication mode, wherein a data rate of the narrowband or ultra-narrowband communication mode is lower than a data rate of the initial communication mode; and
      communicating with the reference device or another endpoint device in the mesh network using an oscillating signal generated by the crystal oscillator while operating in the narrowband or ultra-narrowband communication mode.

9. The system of claim 8, wherein the reference device is further configured to receive the reference timing signal from a global position system (GPS).

10. The system of claim 8, wherein the control signal is a voltage control signal generated with a voltage value in proportion to the frequency difference.

11. The system of claim 10, wherein the voltage control signal is generated based on a voltage reference signal.

12. The system of claim 8, wherein the endpoint device is further configured for:
while operating in the narrowband or ultra-narrowband communication mode,
receiving a reference timing signal over the mesh network from the reference device;
obtaining an updated current value of the frequency of the crystal oscillator;
determining an updated frequency difference between the reference frequency and the updated current value of the frequency;
generating a second control signal based on the updated frequency difference;
adjusting the frequency of the crystal oscillator according to the second control signal; and
transmitting to and receiving communication signals from the reference device or the another endpoint device using the oscillating signal generated by the crystal oscillator.

13. The system of claim 8, wherein pre-determined condition is determined based, at least in part, upon a bandwidth of the narrowband or ultra-narrowband communication mode.

14. The system of claim 8, wherein the crystal oscillator is a voltage-controlled temperature-compensated crystal oscillator (VCTCXO).

15. An endpoint device of a network comprising:
a crystal oscillator configured for generating an oscillating signal with a frequency of the crystal oscillator;
a processor configured to execute computer-readable instructions; and
a memory configured to store the computer-readable instructions that, when executed by the processor, cause the processor to perform operations comprising:
while operating in an initial communication mode,
receiving a reference timing signal over the network from a reference device in the network, wherein the reference device is synchronized to a clock with a frequency of higher accuracy and stability than the frequency of the crystal oscillator;
obtaining a current value of the frequency of the crystal oscillator;
determining a frequency difference between a reference frequency of the reference timing signal and the current value of the frequency of the crystal oscillator;
causing a control signal to be generated based on the frequency difference;
adjusting the frequency of the crystal oscillator by applying the control signal to the crystal oscillator; and
determining that an error of the frequency of the crystal oscillator satisfies a pre-determined condition;
causing the endpoint device to switch to a narrowband or ultra-narrowband communication mode in response to determining that an error of the frequency of the crystal oscillator satisfies a pre-determined condition, wherein a data rate of the narrowband or ultra-narrowband communication mode is lower than a data rate of the initial communication mode; and
while operating in the narrowband or ultra-narrowband communication mode, causing the endpoint device to communicate with another device in the network using an oscillating signal generated by the crystal oscillator.

16. The endpoint device of claim 15, wherein the control signal is a voltage control signal generated with a voltage value in proportion to the frequency difference.

17. The endpoint device of claim 16, wherein the voltage control signal is generated based on a voltage reference signal.

18. The endpoint device of claim 15, the operations further comprise: while operating in the narrowband or ultra-narrowband communication mode,
receiving a reference timing signal over the network from the reference device;
obtaining an updated current value of the frequency of the crystal oscillator;
determining an updated frequency difference between the reference frequency and the updated current value of the frequency;
causing a second control signal to be generated based on the updated frequency difference;
adjusting the frequency of the crystal oscillator by applying the second control signal to the crystal oscillator; and
causing the endpoint device to communicate with another device in the network using the oscillating signal generated by the crystal oscillator.

19. The endpoint device of claim 15, wherein pre-determined condition is determined based, at least in part, upon a bandwidth of the narrowband or ultra-narrowband communication mode.

20. The endpoint device of claim 15, wherein the crystal oscillator is a voltage-controlled temperature-compensated crystal oscillator (VCTCXO).

* * * * *